United States Patent
Tillmann

(10) Patent No.: US 7,264,436 B2
(45) Date of Patent: Sep. 4, 2007

(54) ROBOT-GUIDANCE ASSEMBLY FOR PROVIDING A PRECISION MOTION OF AN OBJECT

(75) Inventor: Ralf Tillmann, Mannheim (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 173 days.

(21) Appl. No.: 11/062,154

(22) Filed: Feb. 18, 2005

(65) Prior Publication Data

US 2005/0183533 A1 Aug. 25, 2005

(30) Foreign Application Priority Data

Feb. 20, 2004 (DE) .................... 10 2004 008 289

(51) Int. Cl.
*B25J 18/02* (2006.01)

(52) U.S. Cl. ................ 414/744.5; 74/490.01; 414/749.1; 414/806; 901/15

(58) Field of Classification Search ............ 414/744.5, 414/800, 806, 490.1; 901/15; 74/490.01, 74/490.08, 490.09
See application file for complete search history.

(56) References Cited

U.S. PATENT DOCUMENTS

| 4,523,100 | A | 6/1985 | Payne ................... 250/561 |
| 6,109,677 | A | 8/2000 | Anthony ................ 294/103.1 |
| 6,910,847 | B1 * | 6/2005 | Blaufus et al. .......... 414/744.5 |
| 2003/0218456 | A1 | 11/2003 | Brunner et al. .......... 324/158.1 |

FOREIGN PATENT DOCUMENTS

WO   WO 02/02282   1/2002

OTHER PUBLICATIONS

European Search Report, dated Jan. 17, 2005.

\* cited by examiner

*Primary Examiner*—Donald Underwood
(74) *Attorney, Agent, or Firm*—Ohlandt, Greeley, Ruggiero & Perle, L.L.P.

(57) ABSTRACT

There is provided a robot-guidance assembly for providing a precision motion of an object, especially for providing a precision motion of a disklike member such as a wafer, including a robot having at least one robot arm. The at least one robot arm has a free end and a fixed end. The robot can move the free end of the at least one robot arm in at least one moving plane. The assembly also includes a guiding apparatus for precisely guiding the free end of the at least one robot arm in the at least one moving plane. There is also provided a method for inspecting a surface of an object.

15 Claims, 7 Drawing Sheets

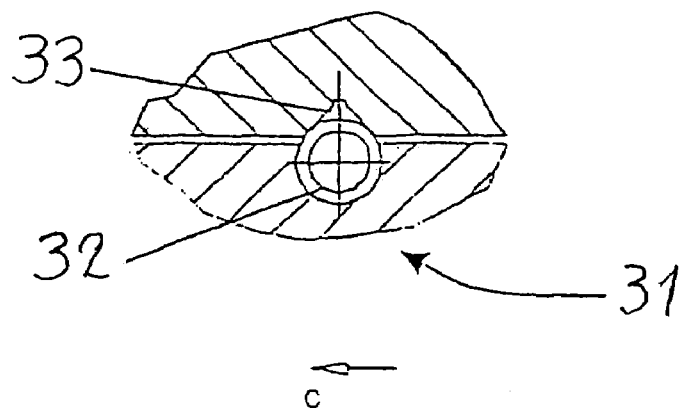
FIG. 3
Fig. 4
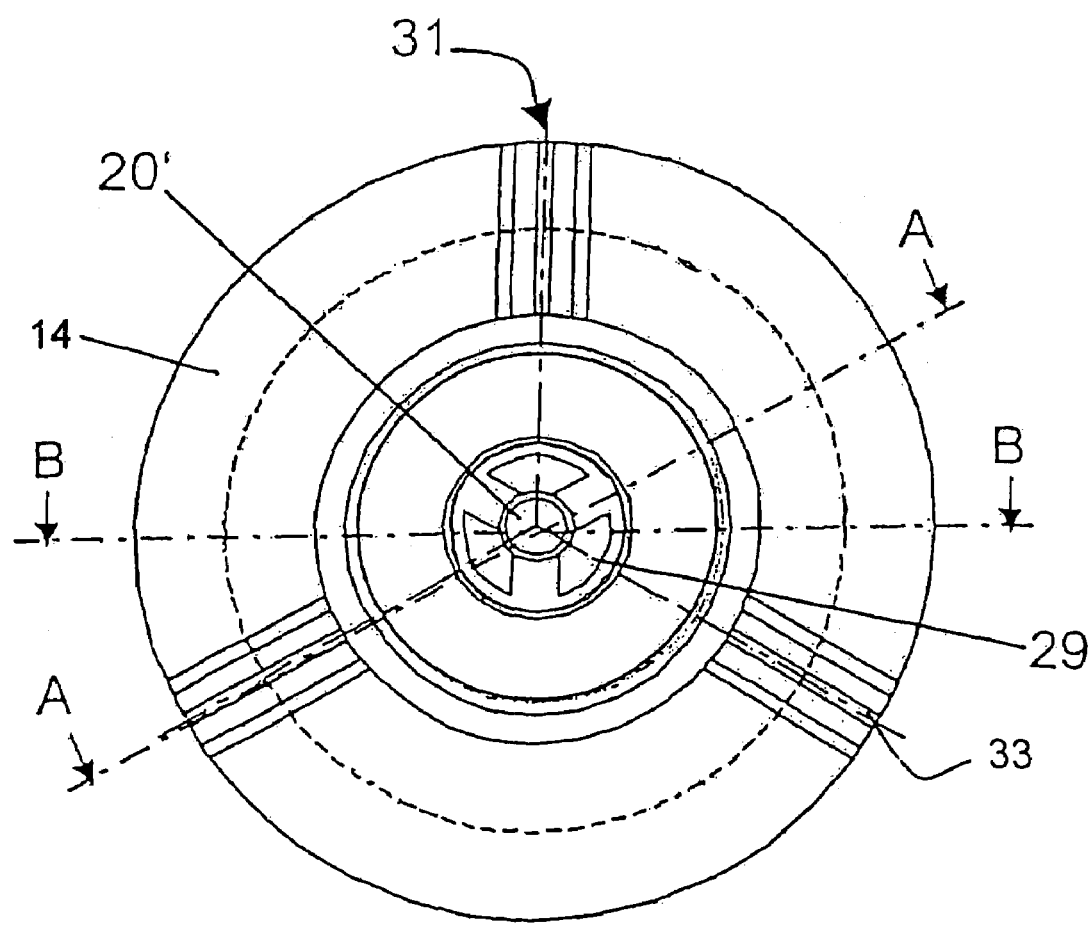

ROBOT-GUIDANCE ASSEMBLY FOR PROVIDING A PRECISION MOTION OF AN OBJECT

BACKGROUND OF THE INVENTION

1. Field of the Invention

CROSS-REFERENCE TO RELATED APPLICATION

The present application is claiming priority of German patent Application No. 10 2004 008 289.8, filed on Feb. 20, 2004, the content of which is herein incorporated by reference.

The invention relates to a robot-guidance assembly for carrying out a precision motion of an object, particularly a disklike object like a wafer, and a method for inspecting the surface of said object.

2. Description of Related Art

Semiconductor wafers are produced by complicated multi-step processes in a clean room environment. The production of sophisticated electronic chips from wafers may include as many as about 150 steps. Technologies in the submicron range are very delicate, and there always exists a chance of error or malfunction at each of the many stages, which ought to be discerned as soon as possible.

Throughout the semiconductor processing precision motion systems, e.g. positioning stages, are used, for example in wafer metrology tools like microscopes.

The common approach is to use a self contained, i.e. a functionally independent, x-y-motion system within the metrology tool, which has a chuck to which the wafer is transferred from the wafer handling system that includes a robot for transporting the wafer from one to the next production or inspection stage.

This results in the typical workflow:
1. The x-y-motion system moves to a load position, at which the wafer is
2. transferred from the robot on to the chuck of the x-y-motion system, after this the wafer is moved into the metrology tool and the
3. metrology or inspection process is carried out, in the following
4. the motion system moves the wafer back to the load position, where it is
5. transferred to the handling system or robot.

Looking at this flow from a systems standpoint one can see that there are two redundant motion systems, i.e. the handling system and the x-y-motion system of the metrology tool. In this kind of handling system the throughput depends strongly on the time the metrology tool has to wait for material handed over by the robot handler. Moreover, it should be noted that in the state of the art systems two separated motion systems are necessary for the handling and the metrology process.

These and other disadvantages have lead to the objects of the present invention, especially to simplify the known motion systems, and to increase the throughput of the production and/or inspection processes.

SUMMARY OF THE INVENTION

Thus far, in general, the invention is a robot-guidance assembly for carrying out a precision motion of an object, especially for carrying out a precision motion of a disklike member like a wafer, comprising a robot including at least one robot arm encompassing a free end and a fixed end being attached to the robot, wherein said robot is adapted to move said free end of said arm at least in one moving plane, whereby a guiding apparatus adapted to and provided for precisely guiding said free end of said arm in at least said plane is provided.

In this way, for the first time, the invention sets forth the possibility to use the robot that is present in every wafer handling system as a motion system for metrology tools as well, canceling the need for an extra motion system within the metrology tool. In a highly advantageous manner, this cuts down costs and also reduces cycling time for a measurement of the wafer due to the time saved for the non-existing wafer transfer from the handling system to the metrology motion system. Additionally it should be noted that for the present invention various types of handling robots like SCARA or linear robots can be applied.

Depending on the motion system of the robot, i.e. whether the robot has a polar coordinate system with a linear-radius- or r-moving-axis and a rotary-stage- or theta-moving-axis (r-theta), or whether it has a Cartesian coordinate system for a x-y-motion, it is provided that the guiding apparatus favorably comprises one or two or even more precision moving or guiding axis. Thus it is guaranteed that the end of the robot arm or an end-effector which is attached to the end of the robot arm for accepting and holding the object or the disklike member at this end, is forced to move exactly along the respective axis, whereby, otherwise, the movement of the end-effector would fail the precision requirements for a scan inside, for instance, a microscope. In case of a r-theta-system generally one axis of motion is sufficient. When a x-y-motion-system is used two stacked linear axis are provided. The direction of motion for these axis is off-set by 90° giving a Cartesian coordinate system.

The choice of the motion system has also an impact on the selection of an appropriate end-effector. Therefore, for instance, according to the invention, if, for example, a SCARA robot with a r-theta motion system is used, it is provided that the end-effector favorably has the capability to rotate the disklike member about its rotary axis. Such an end-effector is disclosed in WO 02/02282 A1 which is hereby incorporated by reference.

Thus, highly advantageously, the end-effector replaces the movement of a separate rotary stage, which would be necessary otherwise. Moreover, this allows that the dependency of the angular orientation of the wrist joint and thus that of the end-effector of a SCARA robot can be cancelled quite easily. The mentioned dependency originates from the fact that the end-effectors of those robots are always oriented radially with respect to the theta axis.

Another further development of the invention relates to the provision of a flexible coupling mechanism for removable coupling or mounting the end of the robot arm and/or the end-effector means to said guiding apparatus. Preferably, the coupling mechanism comprises a pneumatic lock which is arranged on one side or upper side of a stage, whereas the other side of the stage comprises slides. The slides can include bearings of any known kind, e.g. crossed roller bearing, profiled guides with recirculating ball carriages or even air bearings. These slides cooperate with rails arranged on a mounting member for the purpose of precisely guiding the stage, and thus the end of the robot arm or end-effector.

Further more, the inventive coupling mechanism, if at wish, encompasses a rotational degree of freedom, that allows to rotate the end-effector into a locking position, which also opens up the possibility to cancel the dependency of the angular orientation of the wrist joint and thus that of the end-effector as described above According to a preferred embodiment of the invention, the guiding apparatus passively guides said free end of said robot arm. This means that only the robot provides the driving force for the movement of the guided free end of the robot arm and/or the end-effector, respectively. This includes that merely the motors and the position feed back elements of the robot are used for the motion process.

For a even further refinement of the motion system of the inventive assembly, the guiding apparatus comprises additional encoders for a secondary positioning feedback system. Thus, by using a closed-loop control of the stage position, there is no chance that the stage will become lost. Precision motion system in this regard means that the stage is guided in a tolerance band of 2 to 3 μm per 100 mm.

Of course, it is possible that the guiding apparatus itself includes an internal drive. In this case, for example, the robot can be used as a motion controller using its internal feedback system for to close the position control loop. Advantageously, thus there is no need for an additional interface to the process controller. Moreover, it simplifies the control programming since the robot and the metrology motion system use the same control language.

Moreover, according to an additional further development of the invention, it is provided that the guiding apparatus includes a self-contained motion system, as it is known from XYZ-stages of microscopes, wherein a coupling mechanism is provided for allowing the mechanical uncoupling of the end-effector completely from the robot arm. It should be noted that also in this embodiment the robot plays an important roll. In this respected, for instance, the robot can still supply the rotating movement of the disklike member or wafer on an appropriate end-effector (see above) and the control electronics, thus reducing costs and simplifying the system design. The energy supply however is provided via the coupling mechanism.

It is another object of the invention to provide an method for inspecting a surface of an object, especially for inspection a surface of a disklike member like a wafer comprising an inspection device for inspecting the object, and an assembly as described above for positioning and aligning the object within the inspection device.

This method, particularly, is carried out by using a robot, wherein an end-effector of a robot, holding a disklike member or wafer, at a defined position, is attached to a guiding apparatus comprising a motion axis which, when said guiding apparatus is driven, leads to a movement of said end-effector to and inside the inspection tool such that a surface inspection scan can be carried out on said disklike member. After the inspection the end-effector is moved back to the defined position, wherein the end-effector is detached from the guiding apparatus. After the detachment, the robot with its end-effector can move to the next station in the production or inspection process.

BRIEF DESCRIPTION OF THE DRAWINGS

The invention together with additional features and advantages thereof will be best understood from the following description in which

FIG. 3 is a sectional view of an position fixing element in the coupling mechanism according to FIG. 2.

FIG. 4 is a bottom view onto a locking member of the coupling mechanism.

DESCRIPTION OF THE EMBODIMENTS

Figure 1:
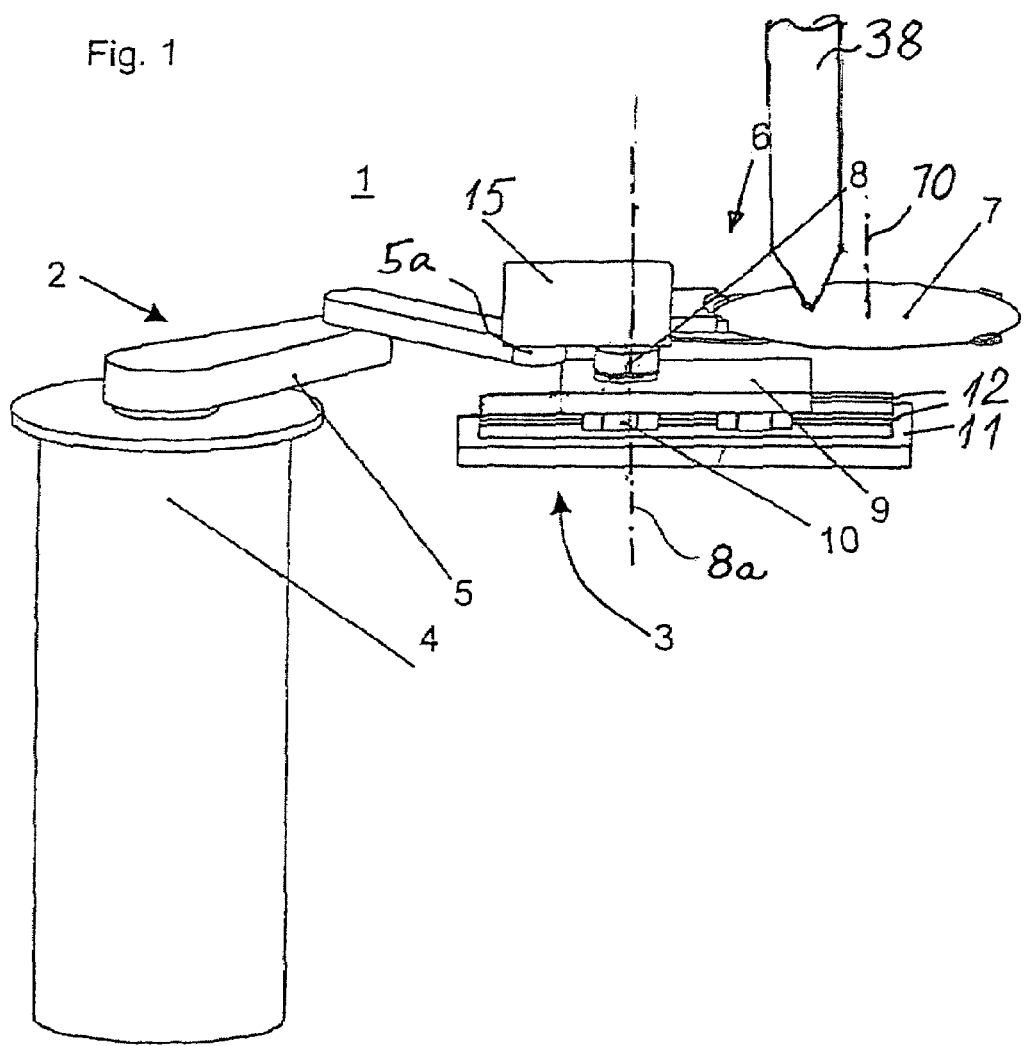
FIG. 1 is a survey of the essential parts of the inventive robot guidance assembly.

FIG. 1 shows an example of a preferred embodiment of the inventive robot-guidance assembly 1. The assembly 1 comprises two main components, namely robot 2 and a precision guiding apparatus 3. The robot 2 shown is a SCARA type robot. It includes a body 4, a robot arm 5 and an end-effector 6 which holds a wafer 7. The robot means 2 includes a robot controller and various motors and mechanical mechanisms not shown in the Figures for driving the robot arm 5 such that the end-effector 6 can be moved in a horizontal plane and also rotated about a coupling axis 8a by means of a mounting mechanism 5a. End-effector 6 is used to grip and hold wafer 7, and robot arm 5 moves end-effector 6 and transfers the wafer 7 from one station to another in an inspection or production apparatus (not shown).

For the handling of a single wafer in an Semiconductor Plant, robot 2 typically has three positioning axes. One axis is the z-axis to move the robot arm together with the wafer 7 vertically up and down, and the two further axes, typically a Theta and a R-axis are to move the wafer 7 horizontally from one station to another in the production process. These types of robots are well known in the art and need not further described hereinafter in detail.

According to the embodiment of FIG. 1, the end-effector 6 has a housing 15 which is attached to the precision guiding apparatus 3 via a coupling mechanism 8. The precision guiding apparatus 3 comprises a linear guide including a stationary guiding device 11 and a movable guiding device 10 and is part of a metrology or inspection tool 38, e.g. a microscope. The assembly 1 comprises a stage 9 which is connected to an upper coupling part of the coupling mechanism 8. The movable guiding device 10 include linear slides. These slides cooperate with a pair of parallel running rails 12 which are arranged on a plate. Movable guiding device 10 and stationary guiding device 11 each includes an encoder for a positioning feedback system. The slides can be of any known kind including crossed roller bearings, profiled guides with recirculating ball carriages or even air bearings. From the functional point of view the precision guiding apparatus 3 is a passive guide, which forces the end-effector 6 to move on a straight line thus providing a precise motion of the end-effector 6 so that the surface of the wafer 7 during this linear movement remains in a defined orientation in space, and a line on the wafer surface can be scanned by the inspection tool 38.

Whereas the linear movement of the end-effector 6 along the rails 12 of the precision guiding apparatus 3 can be produced by the robot 2, in a further development of the invention, the precision guiding apparatus may contain a self-contained motion system or internal drive. This internal drive can be used to shift the stage 9 in a line parallel to the rails 12 and thus scan a line region onto the wafer 7 relative to the inspection tool 38.

Yet for a complete scan, i.e. in order to inspect every point on the wafer surface a single linear motion with respect to the tool 38 is not sufficient. According to the invention, with respect to the embodiment displayed in FIG. 1, this problem is solved by using an end-effector 6 with the capability to rotate the wafer 7 about its axis of symmetry 70 (FIG. 1) which includes a 90° angle with the surface of the wafer 7.

Figure 7:
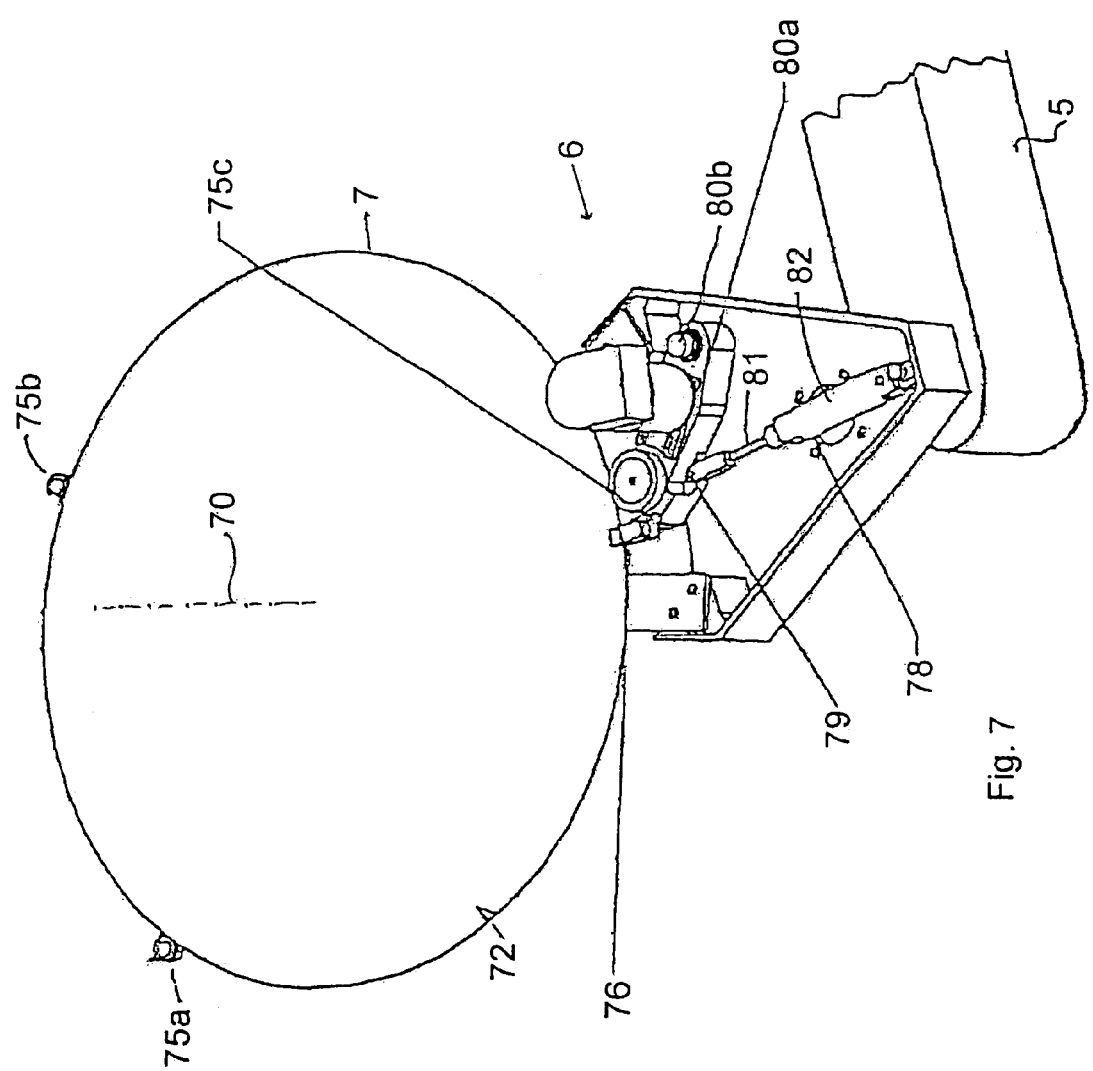
FIG. 7 is a perspective view of an end-effector.

Such an end-effector 6, for instance, is disclosed in WO 02/02282 A1 and shown in FIG. 7. The end-effector 6 is attached to the movable robot arm 5. The end-effector 6 includes a gripping mechanism comprising a drive roller 75c and idler rollers 75a, 75b. Furthermore, FIG. 7 shows a drive roller housing 80a, which pivots at one end about a pin 80b. A gripper actuator cylinder 78 (e.g. a linear motor or a hydraulically operated device) includes a shaft 81, which moves in and out of a cylinder 82 in response to a control signal. The far end of actuator shaft 81 is connected to housing 80a by means of a pin 79. Thus the in and out movement of shaft 81 of actuator 78 causes housing 80a to rotate about pin 80b and, in turn causes drive roller 75c to move, respectively, towards and away from two idler rollers 75a and 75b.

When actuator shaft 81 is retracted into cylinder 82, the separation between drive roller 75c and the idler rollers 75a and 75b becomes large enough to accept wafer 7. Once wafer 7 is located within an area defined by the three rollers 75a, 75b and 75c, actuator shaft 81 is extended out of cylinder 78, thereby pushing drive roller 75c toward the idler rollers until all three rollers contact the outer periphery of and hold wafer 7.

The drive roller 75c can be driven by determined amounts so as to rotate the wafer 7 each time by a predefined angular amount about its axis of symmetry.

The end-effector 6 further comprises an optical device 76 containing an optical sensing system for optical detecting the presence—or absence—of an alignment feature 72 on the wafer edge as it passes by while the wafer 7 is rotated. In this method, the exact angular location of the alignment feature can be determined as a function of the rotational position of the wafer 7. Thus the angular orientation of the wafer 7 can be precisely incremented.

The application of the end-effector 6 even further has the advantage that there is no need any longer for a stand alone pre-aligner because the end-effector 6 is able to pre-align the wafer while moving it from one station to another.

Figure 2:
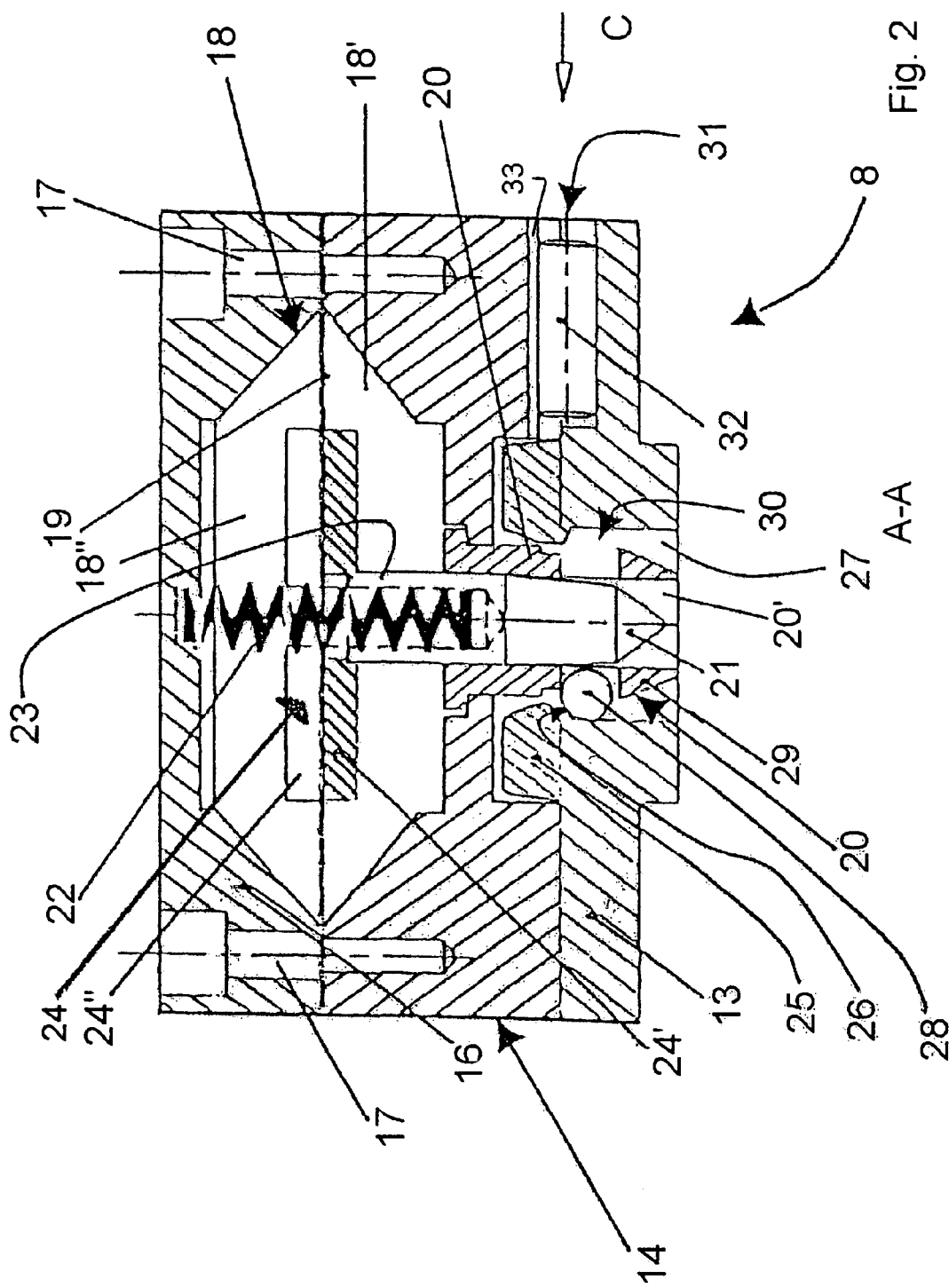
FIG. 2 is a sectional view A-A (see FIG. 4) of one embodiment an inventive end-effector lock or coupling mechanism.

Another essential part of the inventive assembly is the end-effector lock or coupling mechanism 8 as already mentioned above. A detailed view of an embodiment according to the invention can be seen in FIG. 2. The coupling mechanism 8 removably combines the stage 9 with the end-effector 6.

The coupling mechanism 8 includes two essential parts, namely a first coupling part in the form of a locking member 14 including a hollow guide 20, and a second coupling part in the form of a stage plate 13 having a hole 27 in it. Plate 13 is affixed to the stage 9. The locking member 14 includes an end-effector plate 16 which is attached to the underside of the end-effector housing 15 (FIG. 1), in a precise manner. The end-effector plate 16 is fixed to the locking member 14 via screws which are to be inserted into screw-holes 17 extending through the end-effector plate 16 and which find their end in pocket holes of the locking member 14.

The lower end of the locking member 14 is formed as a locking part 30 including a hollow guide 20 and locking balls 28 arranged in pockets of the guide 20. The balls 28 take an angular position of 120° and are held by cage members 29 moveably within the pockets.

The locking member 14 and the end-effector plate 16 form a hollow member 18. The hollow member 18 is divided into an upper and an lower chamber 18", 18' by a diaphragm 19. The diaphragm 19 air-seals the two chambers from one another. At the center of the locking member 14 the hollow guide 20 is provided. The hollow guide 20 is part of the locking member and cooperates with a stage plate hole 27 in the stage plate 13. The hollow guide 20 comprises a through hole 20' which moveably accommodates a cone locking pin 21. The pin 21 is fixed at the diaphragm 19 by plates 24' and 24", which sandwich diaphragm 19 and form a hard center 24.

The locking pin 21 includes a blind hole 23, wherein the lower part of a spring 22 is brought in. Spring 22 engages the bottom of blind hole 23 and is supported by the end-effector plate 16.

The hollow guide 20 is provided for guiding the lower end of locking member 14 into the opening of a locking ring 25 which is part of the stage plate 13 and, in the coupled condition of the assembly, is embedded in a groove in the lower side of locking member 14. The thickness of the ring 25 levels with the lower side of locking member 14 with the exception that, at the inner side of locking ring 25, a ring nose or edge 26 is provided which extends out of the surface. The outer diameter of edge 26 is the same as the inner diameter of stage plate hole 27. Thus the locking member 14 with its guide 20 is centered by edge 26 when entering into the stage plate hole 27 in the coupled position of the coupling mechanism 8. Stage plate hole 27 together with cage members 29 of hollow guide 20 form cages for locking balls 28. For this embodiment, all together, there are three locking balls at a distance of 120°.

Moreover, the mounting mechanism 5a is adapted for rotating the end-effector 6 into a position for being locked. To this end, an angular position fixing mechanism 31 is provided comprising three roll bodies 32 as position fixing elements. These elements 31 are arranged in blind holes managed at the interface between locking member 14 and stage plate 13 in radial direction and distributed along a circle (see FIG. 4). The roll bodies are thus sandwiched between the lower side of locking member 14 and the upper side of the stage plate 13. Furthermore, the blind holes in the lower surface of locking member 14 include key notches 33 at an angular distance of 120° (see FIG. 4). The angle position fixing mechanism 31 thus provides a defined orientation between the locking member 14 and the stage plate 13 in the coupled state of the inventive coupling mechanism 8.

Figure 5A:
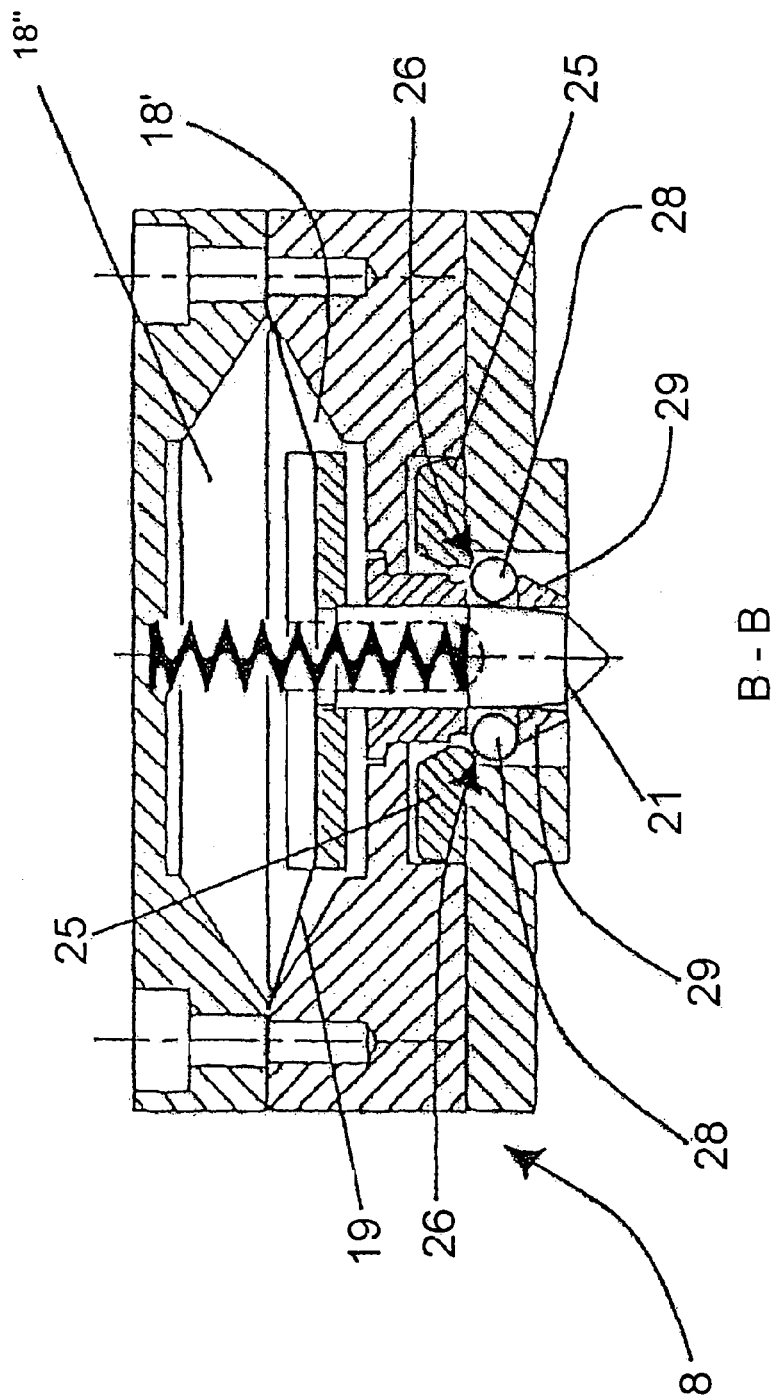
FIG. 5A is a sectional view B-B in FIG. 4 of the coupling mechanism in the locked position thereof.
Figure 5B:
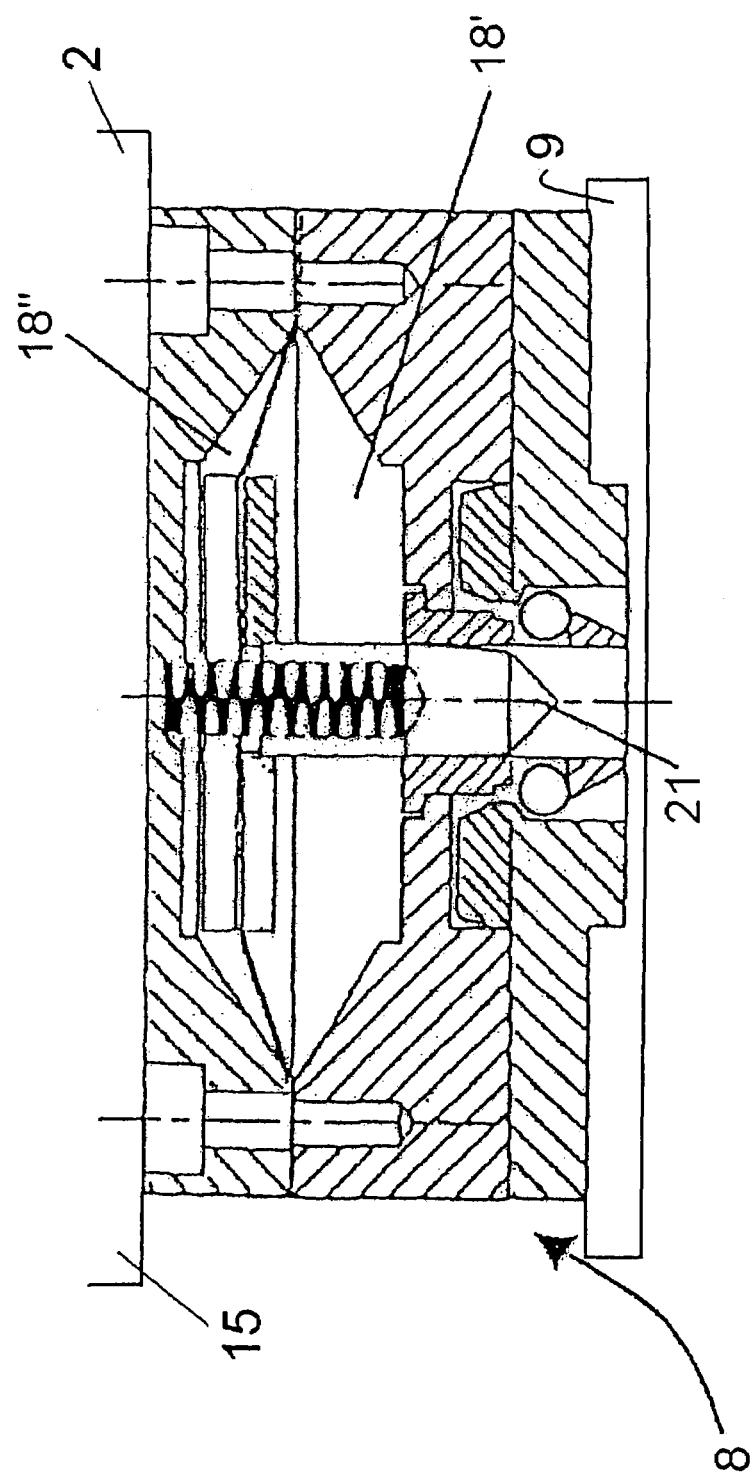
FIG. 5B is a sectional view B-B in FIG. 4 of the coupling mechanism in the unlocked position thereof.

The operation of the locking mechanism 8 is explained with FIGS. 5A and 5B. First, the angular position of the end-effector 6 relative to the precision guiding apparatus 3 is adapted so that the angular position fixing mechanism 31 can be locked. The coupled position of the mechanism 8 can be locked pneumatically. To that end, chamber 18' is charged with negative pressure so as to move the diaphragm 19 and the locking pin 21 downwardly. The locking pin 21 blocks locking balls 28 which engage the shoulders at edges 26. FIG. 5A displays mechanism 8 in its locked position, wherein chamber 18" is on higher pressure in that a negative pressure is applied to chamber 18'. Such negative pressure lock is especially favorable in a clean room environment. Seen from the initial position (FIG. 5B), a downward movement of locking pin 21 is achieved. In this movement, the cone of locking pin 21 pushes cage members 29 aside. This in turn presses locking balls 28 radially onto edge 26 of locking ring 25 so as to lock stage plate 13 onto locking member 14.

FIG. 5B shows the unlocked condition of coupling mechanism 8. Therein, negative pressure is shut off and spring 22 together with the pressures in the chambers 18', 18" hold the diaphragm 19 in equilibrium position. In this condition, locking pin 21 is in its up-position and the lock of the coupling mechanism 8 is released.

The inventive coupling mechanism favorably allows to couple the end-effector 6 into a repeatable position, as well as an exactly repeatable orientation in space, thus guaranteeing that the wafer surface 7 is always parallel to the direction of the linear guide. Of course, the invention is not restricted to pneumatic locks as described above but can be also of a electro mechanic or magnetic kind. Note that even gravity could be sufficient.

Figure 6:
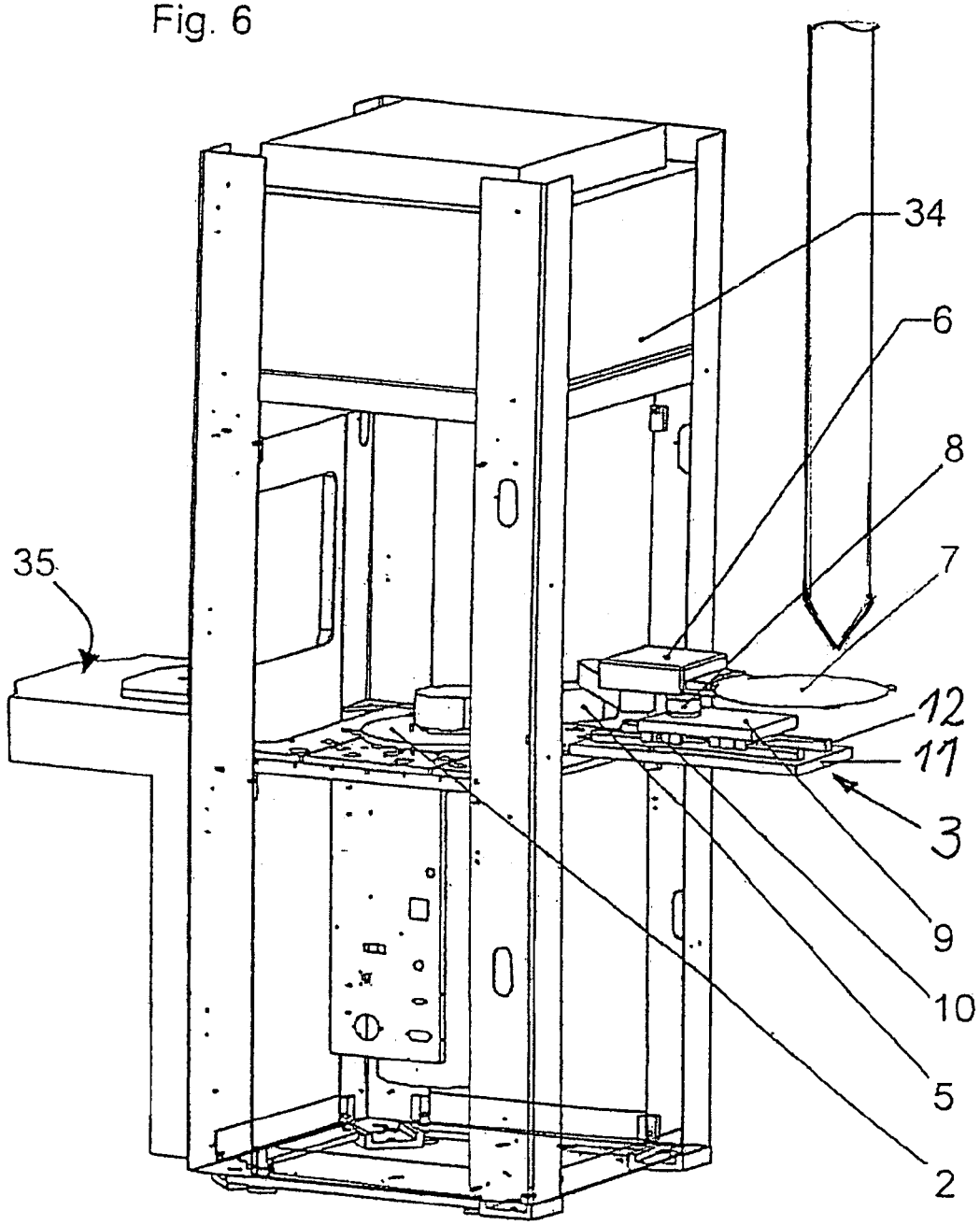
FIG. 6 shows the inventive assembly built in a rack.

FIG. 6 shows the inventive assembly 1 build in a rack 34. Rack 34 comprises on its front side a Load Port for FOUP's, i.e. a front opening unified pod 35, and on its rear side the precision guiding apparatus 3 for precisely guiding the end of robot arm 5 and the end-effector 6, respectively. Thus far, the precision guiding apparatus 3 replaces a conventional XY-stage on which normally robot 2 has to place wafer 7 for any kind of purpose. Of course it could be provided that the rack 34 as a whole or at least the precision guiding 3 are vibration-isolated.

The invention claimed is:

1. A robot-guidance assembly for carrying out precision motions of a disklike object, comprising
 a robot including at least one robot arm having a first free end and a second driving end so that said first end of said robot arm is adapted to be moved in at least one plane of motion;
 an end-effector for holding and transferring said disklike object, said end-effector being attached to said first end of said robot arm;
 a precision guiding apparatus being part of a production or inspection apparatus and adapted to and provided for precisely guiding said end-effector in said at least one plane of motion and extending parallelly to said at least one plane of motion, said precision guiding apparatus including a stationary guiding device and a movable guiding device which is guided on said stationary guiding device; and
 a coupling mechanism for removable mounting one of (a) said first end on said robot arm, or (b) said end-effector, to said precision guiding apparatus so that said robot is prepared to drive said movable guiding device when said coupling mechanism is coupled.

2. The robot-guidance assembly according to claim 1, wherein said precision guiding apparatus comprises parallel running rails and slides cooperating with one another.

3. The robot-guidance assembly according to claim 1, wherein said disklike object has an axis of symmetry perpendicular to a surface of the disklike object and wherein said end-effector comprises a mechanism for rotating said disklike object about said axis of symmetry.

4. The robot-guidance assembly according to claim 1, wherein said coupling mechanism comprises a first coupling part attached to a housing of said end-effector, and a second coupling part attached to said movable guiding device, said first and second coupling parts, when coupled together, define an axis of rotation and have a rotational locking position, and
 wherein said first end of said robot arm includes a mounting mechanism adapted to rotate said end-effector into said rotational locking position.

5. The robot-guidance assembly according to claim 1, wherein said precision guiding device comprises a stage.

6. The robot-guidance assembly according to claim 5, wherein the movable guiding device comprises said stage and includes first and second sides, said coupling mechanism being attached to said first side, and said second side being supported on said stationary guiding device.

7. The robot-guidance assembly according claim 1, wherein said precision guiding apparatus comprises encoders for a positioning feedback system, to detect the position of said movable guiding device relatively to said stationary guiding device.

8. The robot-guidance assembly according to claim 1, wherein said end-effector includes a housing and said robot arm includes a mounting mechanism, said housing being removable mounted to said first end of said first arm.

9. The robot-guidance assembly according to claim 1, wherein said coupling mechanism comprises:
 a first coupling part attached to said one of said first end of said robot arm and of said end-effector, and
 a second coupling part attached to said movable guiding device of said precision guiding apparatus,
 said first coupling part including a locking member and
 said second coupling part including a receptable opening for receiving said locking member when said first and second coupling parts are coupled together.

10. The robot-guidance assembly according to claim 9, wherein said locking member includes locking balls, a locking pin and a drive device for moving said locking pin,
 wherein said drive device moves said locking pin in and out of engagement with said locking balls so as to lock, or unlock, said first coupling part with said second coupling part.

11. The robot-guidance assembly according to claim 10, wherein said drive device for said locking pin comprises a diaphragm dividing an inner space of said coupling means in a first chamber near said first end of said robot arm, and a second chamber near said precision guiding apparatus,
 further comprising a device for creating a pressure difference between said first and second chambers acting onto said diaphragm so as to move said locking pin in or out of locking position.

12. The robot-guidance assembly according to claim 9, wherein said first coupling part and said second coupling part are rotable to one another,
 further comprising a rotational position fixing device for latching the position of said first coupling part relative to said second coupling part.

13. The robot-guidance assembly according to claims 9, wherein said first coupling part comprises a hollow member attached to a housing of said end effector and including a locking pin guided in said hollow member, wherein said second coupling part comprises a stage plate affixed to a stage and cooperating with said locking member of said first coupling part and said locking pin,
 said robot-guidance assembly further comprising a drive device for said locking pin to lock and unlock said locking member and said stage plate so as to connect or disconnect said end-effector to or from said movable guiding device.

14. The robot-guidance assembly according to claim 13, wherein said locking member comprises a diaphragm drive for said locking pin.

15. A method for inspecting a surface of a disklike object having an axis of symmetry in using a robot arm having an end-effector provided for rotating said disklike object about said axis of symmetry, a precision guiding apparatus defining a guiding axis parallel to said surface of said disklike object, a coupling mechanism for removably mounting said robot arm with said end-effector to said precision guiding apparatus, and an inspection tool arranged to inspect said surface of said disklike object, comprising the steps of:
   a) gripping said disklike object by said end-effector in a loading station;
   b) moving said end-effector with said disklike object to a first defined position above said precision guiding apparatus;
   c) coupling said end-effector to said precision guiding apparatus;
   d) moving said end-effector parallel to said guiding axis;
   e) inspecting a first region of said surface of said disklike object while moving according to step d);
   f) rotating said disklike object to a second defined position above said precision guiding apparatus;
   g) moving said disklike object parallel to said guiding axis;
   h) inspecting a second region of said surface of said disklike object while moving according to step g);
   i) continuing to rotate and move said disklike object similar to steps d), f), g) for inspecting further regions of said disklike object similar to steps e) and h);
   j) uncoupling said end-effector from said precision guiding apparatus; and
   k) moving said end-effector with said disklike object to an unloading station.

* * * * *